United States Patent [19]
Kato et al.

[11] Patent Number: 5,519,364
[45] Date of Patent: May 21, 1996

[54] HIGH-FREQUENCY SWITCH

[75] Inventors: Mitsuhide Kato; Koji Furutani, both of Shiga; Teruhisa Tsuru, Kyoto, all of Japan

[73] Assignee: Murata Manufacturing Co., Ltd., Japan

[21] Appl. No.: 464,447

[22] Filed: Jun. 5, 1995

[30] Foreign Application Priority Data

Jun. 30, 1994 [JP] Japan .................................... 6-149378

[51] Int. Cl.⁶ ...................................................... H01P 1/15
[52] U.S. Cl. ............................................ 333/103; 333/104
[58] Field of Search .................................... 333/103, 104; 455/78–83

[56] References Cited

U.S. PATENT DOCUMENTS 3,678,414 7/1972 Hallford ............................... 333/103 X

FOREIGN PATENT DOCUMENTS 212502 8/1992 Japan ..................................... 333/104

Primary Examiner—Paul Gensler
Attorney, Agent, or Firm—Majestic, Parsons, Siebert & Hsue

[57] ABSTRACT

A high-frequency switch, having a first port, a second port and a third port and serving to selectively connect the second port to the first or third port, includes a first distributed constant line and a second distributed constant line which are connected in series between the first and second ports, a third distributed constant line and a fourth distributed constant line which are connected in series between the second and third ports, a first diode connected between the first port and the ground, a second diode connected between a junction point between the first and second distributed constant lines and the ground, a third diode connected between a junction point between the third and fourth distributed constant lines and the ground, a fourth diode connected between the third port and the ground, a first resistor and a second resistor which are connected in series between grounded electrodes of the first and fourth diodes, and a third resistor and a fourth resistor which are connected in series between grounded electrodes of the second and third diodes, wherein the first and second diodes have different polarity, the third and fourth diodes have different polarity and the first and fourth diodes have different polarity with respect to a line between the first and third ports.

12 Claims, 2 Drawing Sheets

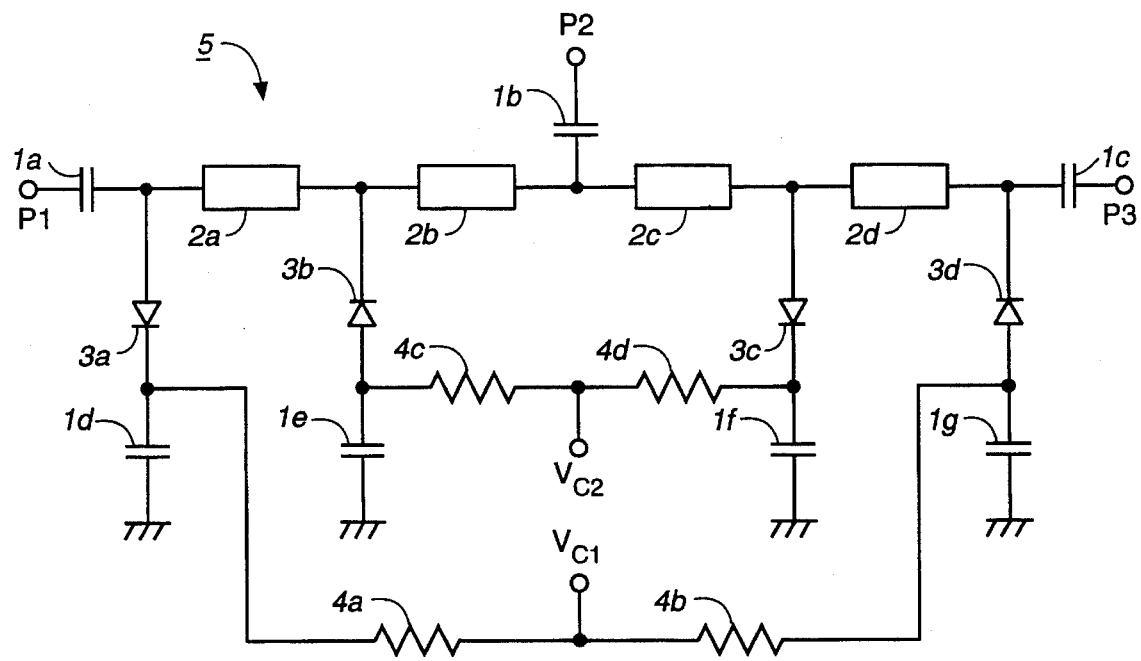
FIG._1
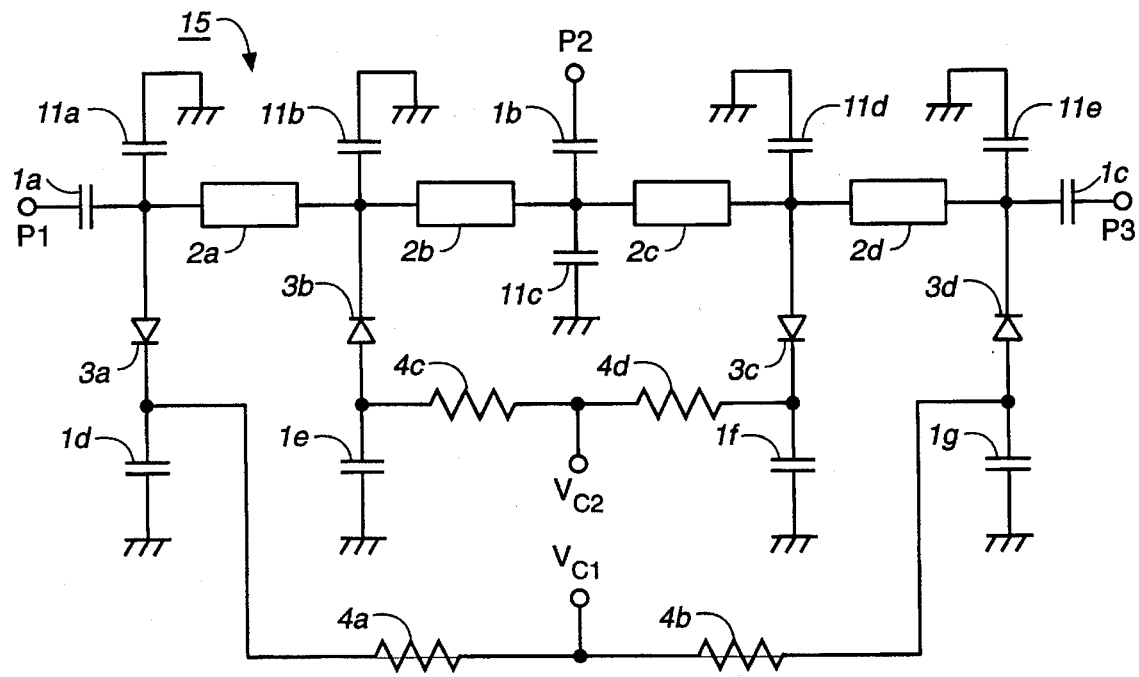
FIG._2

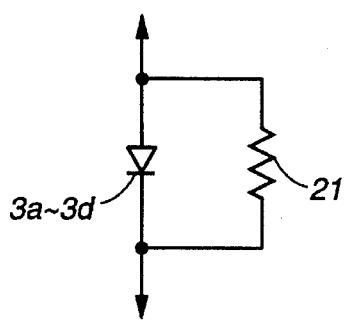
FIG._3
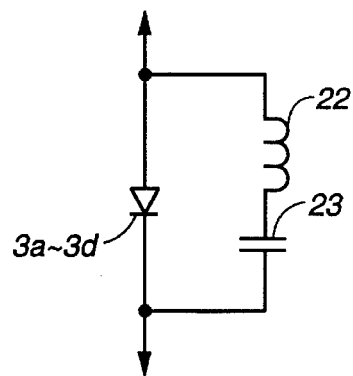
FIG._4
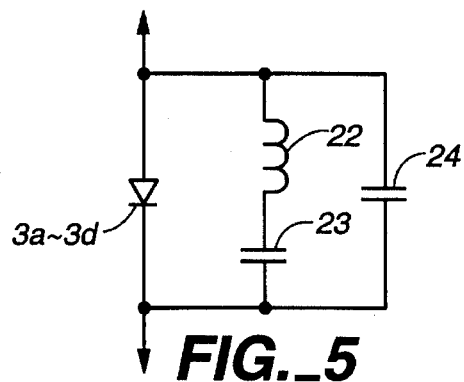
FIG._5
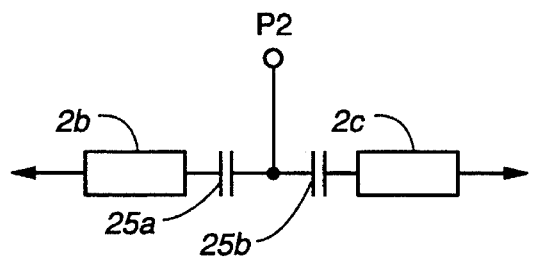
FIG._6
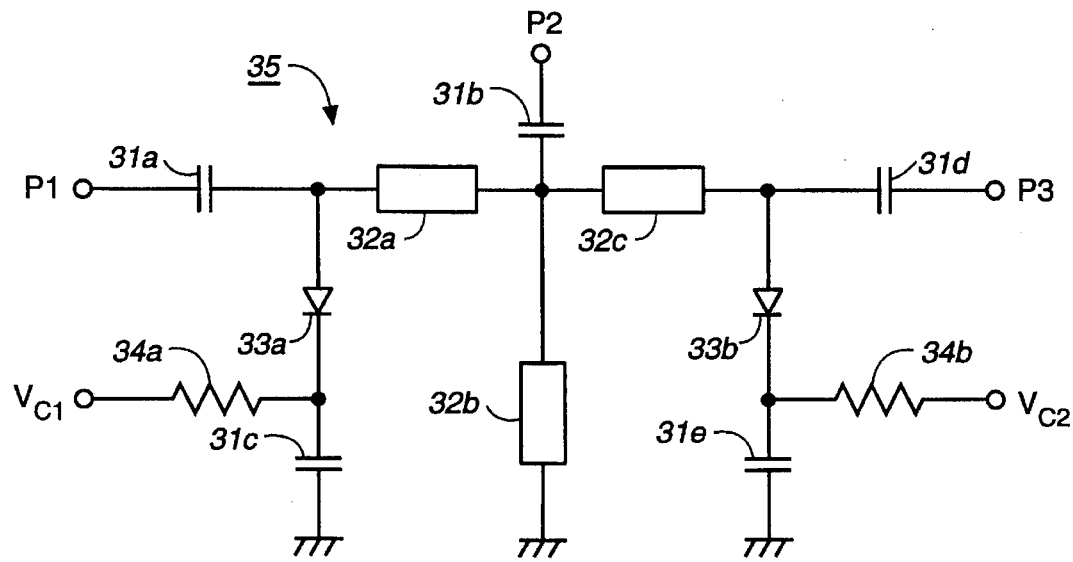
FIG._7
(PRIOR ART)

HIGH-FREQUENCY SWITCH

BACKGROUND OF THE INVENTION

This invention relates to a high-frequency switch for switching the signal route in a high-frequency circuit such as a portable telephone.

FIG. 7 shows a prior art high-frequency switch 35 having ports P1 and P2 connected by a series connection of a capacitor 31a, a strip line 31a and another capacitor 31b, a junction point between the capacitor 31a and the strip line 31a being connected to the anode of a diode 33a, the cathode of the diode 33a being grounded through a grounding capacitor 31c and also connected to a control terminal Vc1 through a resistor 34a. A junction point between the capacitor 31b and the strip line 31a is not only grounded through another strip line 32b but also connected to a third port P3 through a series connection of another strip line 32c and another capacitor 31d, a junction point between the capacitor 31d and the strip line 32c being connected to the anode of another diode 33b, and the cathode of this diode 33b being not only grounded through another grounding capacitor 31e but also connected through another resistor 34b to another control terminal Vc2. The strip lines 31a and 32c are each a 90-degree phase-shifter with a length equal to or less than one quarter of the signal wavelength at a desired frequency. The strip line 32b is either a high-impedance line or a 90-degree phase shifter.

With the high-frequency switch 35 thus structured, if a positive control voltage is applied to the first control terminal Vc1 and a negative control voltage to the second control terminal Vc2, a reverse bias voltage is applied to the first diode 33a to put it in the OFF condition and a forward bias voltage to the second diode 33b to put it in the ON condition. Thus, the impedance of the strip line 32c, which is grounded through the second diode 33b, becomes infinitely large as seen from the second port P2, allowing signals to travel between the ports P1 and P2, but not between the ports P2 and P3. Similarly, if a negative control voltage is applied to the first control terminal Vc1 and a positive control voltage to the second control terminal Vc2, a forward bias voltage is applied to the first diode 33a to put it in the ON condition and a reverse bias voltage to the second diode 33b to put it in the OFF condition. Thus, the impedance of the strip line 31a, which is grounded through the first diode 33a, becomes infinitely large as seen from the second port P2, allowing signals to travel between the ports P2 and P3, but not between the ports P1 and P2. The strip line 32b serves as a DC route for allowing a direct current to travel through the diode 33a or 33b by the control voltage applied to the control terminal Vc1 or Vc2. In high-frequency situations, the impedance of the strip line 32b becomes large as seen from the junction point between the strip lines 31a and 32c so as to reduce the insertion loss and the reflection loss. In summary, the circuit as shown in FIG. 7 serves as a switch, connecting port P2 selectively to port P1 or P2 by the voltages applied to the control terminals Vc1 and Vc2.

With the prior art high-frequency switch 35, however, the isolation between the ports P1 and P2 is as low as 35 dB. If it is used for a synthesizer of a portable telephone, for example, it is not possible to obtain sufficient communication capability. This makes it necessary to provide another circuit for obtaining sufficient isolation or to use a multi-stage switch, but the circuit becomes complicated and the production cost is adversely affected. Moreover, since two voltage sources are required (one positive and another negative) to be applied to the control terminals Vc1 and Vc2, an extra restriction is imposed in the design of the source circuit, and the production cost of portable telephones becomes higher.

SUMMARY OF THE INVENTION

It is therefore an object of this invention to eliminate such problems of prior art technology as described above by providing a high-frequency switch with high isolation and operable with a single power source.

A high-frequency switch embodying the present invention, with which the above and other objects can be accomplished, may be characterized as comprising three ports consisting of a first port, a second port and a third port, a first distributed constant line and a second distributed constant line which are connected in series between the first and second ports, a third distributed constant line and a fourth distributed constant line which are connected in series between the second and third ports, a first diode connected between the first port and the ground, a second diode connected between a junction point between the first and second distributed constant lines and the ground, a third diode connected between a junction point between the third and fourth distributed constant lines and the ground, a fourth diode connected between the third port and the ground, a first resistor and a second resistor which are connected in series between grounded electrodes of the first and fourth diodes, and a third resistor and a fourth resistor which are connected in series between grounded electrodes of the second and third diodes, the first and second diodes having different polarity, the third and fourth diodes having different polarity and the first and fourth diodes having different polarity with respect to a line between the first and third ports, the switch being capable of selectively connecting the second port with the first port or the third port.

At least one grounding capacitor may be inserted between at least one end of at least one of the distributed constant lines. A discharge resistor may be connected between both electrodes of at least one of the diodes. An inductance-providing line having inductance may be connected between both electrodes of at least one of the diodes such that electrostatic capacitance of this one diode when in OFF condition and the inductance of this inductance-providing line together serve as a parallel-connected resonant circuit. Alternatively, a parallel connection of an inductance-providing line having inductance and a capacitor-containing line may be connected between both electrodes of at least one of the diodes such that combined electrostatic capacitance of this one diode when in OFF condition and the capacitor-containing line and the inductance of this inductance-providing line together serve as a parallel-connected resonant circuit.

With a high-frequency switch thus structured according to this invention, the isolation between the first and third ports is increased because distributed constant lines are provided in two stages. If at least one grounding capacitor is inserted between at least one end of at least one of the distributed constant lines and the ground, the characteristic impedance of the switch can be adjusted and impedance matching can be effected for a line or another circuit which is connected to the switch. If a discharge resistor is connected to both ends of at least one of the diodes, the switching operation can be carried out more smoothly. If a distributed constant line or a series connection of an inductor and a capacitor is connected to both sides of at least one of the diodes so as to form a parallel-connected resonant circuit with the electrostatic capacitance of the diode when it is in the OFF condition and the inductance of the distributed constant line or the inductor, the insertion loss and the reflection loss can be reduced. If not only a distributed constant line or a series connection of an inductor and a capacitor but also another capacitor is connected to both sides of at least one of the diodes so as to form a parallel-connected resonant circuit with the combination of the electrostatic capacitance of the diode when it is in the OFF condition and the additional capacitance and the inductance of the distributed constant line or the inductor, the insertion loss and the refection loss can also be reduced.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a circuit diagram of a high-frequency switch according to a first embodiment of this invention;

FIG. 2 is a circuit diagram of another high-frequency switch according to a second embodiment of this invention;

FIG. 3 is a circuit diagram of a portion of still another high-frequency switch according to a third embodiment of this invention having a discharge resistor connected to at least one of its diodes;

FIG. 4 is a circuit diagram of a portion of still another high-frequency switch according to a fourth embodiment of this invention having a series connection of an inductor and a capacitor connected to at least one of its diodes;

FIG. 5 is a circuit diagram of a portion of still another high-frequency switch according to a fifth embodiment of this invention having both a series connection of an inductor and a capacitor and another capacitor connected to at least one of its diodes;

FIG. 6 is a circuit diagram showing a variation in the manner of connecting capacitors in FIGS. 1 and 2; and FIG. 7 is a circuit diagram of a prior art high-frequency switch.

DETAILED DESCRIPTION OF THE INVENTION

In what follows, a high-frequency switch according to this invention will be described with reference to drawings. FIG. 1 represents a high-frequency switch 5 according to a first embodiment of this invention, having a series connection of a capacitor 1a, strip lines 2a and 2b and another capacitor 1b connected between ports P1 and P2, and another series connection of strip lines 2c and 2d and a capacitor 1c connected between a junction point between the capacitor 1b and the strip line 2b. A junction between the capacitor 1a and the strip line 2a is connected to the anode of a diode 3a, of which the cathode is grounded through a grounding capacitor 1d. A junction between the strip lines 2a and 2b is connected to the cathode of another diode 3b, of which the anode is grounded through another grounding capacitor 1e. A junction between the strip lines 2c and 2d is connected to the anode of a third diode 3c, of which the cathode is grounded through a third grounding capacitor 1f. A junction point between the strip line 2d and the capacitor 1c is connected to the cathode of a fourth diode 3d, of which the anode is grounded through a fourth grounding capacitor 1g.

A junction point between the cathode of the diode 3a and the capacitor 1d and a junction point between the anode of the diode 3d and the capacitor 1g are connected by a series connection of two resistors 4a and 4b, and a junction point between the anode of the diode 3b and the capacitor 1e and a junction point between the cathode of the diode 3c and the capacitor 1f are connected by a series connection of two resistors 4c and 4d. A junction point between the resistors 4a and 4b and a junction point between the resistors 4c and 4d serve respectively as control terminals Vc1 and Vc2 to form the high-frequency switch 5. The capacitors 1a, 1b, 1c, 1d, 1e, 1f and 1g serve to limit the currents caused by the voltages applied to the control terminals Vc1 and Vc2 to flow only through the branches containing the diodes 3a, 3b, 3c and 3d so as not to affect the other components. The strip lines 2a, 2b, 2c and 2d are 90-degree phase shifters with length equal to or less than ¼ of the wavelength of a signal at a specified frequency. The resistors 4a, 4b, 4c and 4d are inserted for the purpose of causing a constant current through the diodes 3a, 3b, 3c and 3d.

The operations of the high-frequency switch 5 will be explained next. If a positive control voltage is applied to the first control terminal Vc1 and the second control terminal Vc2 is grounded, or if the first control terminal Vc1 is grounded and a negative control voltage is applied to the second control terminal Vc2, the bias voltage is in the reverse direction for the diodes 3a and 3b and in the forward direction for the diodes 3c and 3d, putting the diodes 3a and 3b in the OFF condition and the diodes 3c and 3d in the ON condition. Accordingly, the strip lines 2c and 2d are grounded through the diodes 3c and 3d, and their impedance becomes infinitely large as seen from the port P2. Thus, a signal can flow between the ports P1 and P2 but no signal can flow between the ports P2 and P3. If a negative control voltage is applied to the first control terminal Vc1 and the second control terminal Vc2 is grounded, or if the first control terminal Vc1 is grounded and a positive control voltage is applied to the second control terminal Vc2, on the other hand, the bias voltage is in forward direction for the diodes 3a and 3b and in the reverse direction for the diodes 3c and 3d, putting the diodes 3a and 3b in the ON condition and the diodes 3c and 3d in the OFF condition. Accordingly, the strip lines 2a and 2b are grounded through the diodes 3a and 3b, and their impedance becomes infinitely large as seen from the port P2. Thus, a signal can flow between the ports P2 and P3 but no signal can flow between the ports P1 and P2.

The high-frequency switch 5 thus structured may be characterized as having strip lines in two stages between each pair of ports. As a result, the isolation between the ports P1 and P3 is increased to 70 db, which is twice as large as that of the prior art switch 35 described above. Moreover, only a single power source, either positive or negative, is required for the control terminals Vc1 and Vc2. Since two diodes 3a and 3b or 3c and 3d are connected in series in the bias lines between the two control terminals Vc1 and Vc2, the switch 5 can be operated at a low power consumption. Since the resistors 4a, 4b, 4c and 4d serve to prevent the lowering of the isolation between the ports P1 and P3, resistors with high resistance are preferred.

The polarity directions of the diodes 3a, 3b, 3c and 3d are not required to be as described above and shown in FIG. 1, but may be reversed. If this is done, the polarity of the control voltage applied between the control terminals Vc1 and Vc2 and the connection relationship of the ports P1, P2 and P3 become reversed. In other words, if a positive control voltage is applied to the control terminal Vc1 and the other control terminal Vc2 is grounded, or if the first control terminal Vc1 is grounded and a negative control voltage is applied to the other control terminal Vc2, a signal can flow between the ports P2 and P3, but no signal can flow between the ports P1 and P2. If a negative control voltage is applied to the control terminal Vc1 and the other control terminal Vc2 is grounded, or if the first control terminal Vc1 is grounded and a positive control voltage is applied to the other control terminal Vc2, a signal can flow between the ports P1 and P2, but no signal can flow between the ports P2 and P3. It is necessary, however, that the diodes 3a and 3b, the diodes 3c and 3d and the diodes 3a and 3d are opposite to each other in polarity.

FIG. 2 shows another high-frequency switch 15 structured by grounding junction points between the capacitor 1a and the strip line 2a, between the strip lines 2a and 2b, between the strip lines 2b and 2c, between the strip lines 2c and 2d and between the strip line 2d and the capacitor 1c of the switch 5 described above respectively through grounding capacitors 11a, 11b, 11c, 11d and 11e. The high-frequency switch 15 according to the second embodiment of this invention functions similarly and has similar effects as the switch 5 according to the first embodiment. Because the grounding capacitors 11a, 11b, 11c, 11d and 11e serve to adjust the characteristic impedance, the insertion loss and the reflection loss can be reduced. The strip lines 2a, 2b, 2c and 2d can be made shorter, and hence the switch 15 can be made compact.

FIGS. 3, 4 and 5 show high-frequency switches according to third, fourth and fifth embodiments of the invention which are different from the switches 5 and 15 only in that a discharge resistor, a series connection of an inductor and a capacitor and both a series connection of an inductor and a capacitor and another capacitor are respectively connected to at least one of the diodes 3a, 3b, 3c and 3d. Thus, only one of the diodes 3a, 3b, 3c and 3d and the component connected thereto will be shown in FIGS. 3, 4 and 5.

As shown in FIG. 3, a high-frequency switch according to the third embodiment is characterized as having a discharge resistor 21 connected to both sides of at least one of the diodes 3a, 3b, 3c and 3d. The discharge resistor 21 serves to discharge the charges accumulated by the electrostatic capacitance of the diode 3a, 3b, 3c or 3d when in the OFF condition such that the switching from an OFF condition to an ON condition can be effected smoothly.

According to the fourth embodiment of the invention, as shown in FIG. 4, a series connection of an inductor 22 and a capacitor 23 is connected to both sides of at least one of the diodes 3a, 3b, 3c and 3d such that a parallel-connected resonant circuit is formed with the static capacitance of the diode 3a, 3b, 3c or 3d and the inductor 22. If the resonant frequency matches the signal frequency, the impedance at the junction points with the strip lines 2a, 2b, 2c and 2d increases when the diodes 3a, 3b, 3c and 3d are in the OFF condition, and this serves to reduce the insertion loss and the reflection loss. The capacitor 23 is inserted for the purpose of preventing a direct current through the inductor 22.

If the electrostatic capacitance of the diodes 3a, 3b, 3c and 3d is small such that a desired resonant frequency cannot be obtained, an additional capacitor 24 may be connected to both sides of the diode 3a, 3b, 3c or 3d, as shown in FIG. 5 according to the fifth embodiment of the invention, in addition to the series connection of an inductor 22 and a capacitor 23 as shown in FIG. 4, such that a parallel-connected resonant circuit is formed with the combination of the electrostatic capacitance of the diode 3a, 3b, 3c or 3d and the additional capacitor 24 and the inductor 22.

FIG. 6 shows a variation to the embodiments of the invention which have been described above, comprising a series connection of two capacitors 25a and 25b connected between the strip lines 2b and 2c shown in FIGS. 1 and 2, and connection of the port P2 to a junction point between the two capacitors 25a and 25b. When the distribution of the applied control voltage by the resistors 4a, 4b, 4c and 4d is varied and the bias voltages applied to the individual diodes 3a, 3b, 3c and 3d are changed, the potential difference does not become zero between the cathode of the diode 3b and the anode of the diode 3c in the case of a circuit shown in FIGS. 1 or 2 such that there will be a flow of direct current between the strip lines 2b and 2c. The insertion of the capacitors 25a and 25b, as shown in FIG. 6, is for preventing such a flow of direct current between the strip lines 2b and 2c.

As a further variation of the disclosure above, decoupling capacitors may be connected between the control terminals Vc1 and Vc2 and the ground. Although strip lines have been used in all embodiments described above as examples, other known kinds of distributed constant lines may be used such as coplanar guides and slot lines.

In summary, the isolation between ports P1 and P3 of a high-frequency switch according to this invention is twice as big as that for prior art switches because distributed constant lines are provided in two stages so as to improve the communication capability of instruments such as portable telephones. Since the need for an additional circuit for increasing isolation or providing multi-stage switches is eliminated, the circuit is simplified, the switch can be made compact and the production cost can be reduced. Since only one power source (positive or negative potential) is required for application to the control terminals, furthermore, the limitation on the design of the source circuit is removed and the cost of instruments such as portable telephones can be reduced.

If a discharge resistor is connected to both ends of at least one of the diodes, the switching operation can be carried out more smoothly. If a distributed constant line or a series connection of an inductor and a capacitor is connected to both sides of at least one of the diodes so as to form a parallel-connected resonant circuit with the electrostatic capacitance of the diode when it is in the OFF condition and the inductance of the distributed constant line or the inductor, the insertion loss and the reflection loss can be reduced. If not only a distributed constant line or a series connection of an inductor and a capacitor but also another capacitor is connected to both sides of at least one of the diodes so as to form a parallel-connected resonant circuit with the combination of the electrostatic capacitance of the diode when it is in the OFF condition and the additional capacitance and the inductance of the distributed constant line or the inductor, the insertion loss and the reflection loss can also be reduced. Since two diodes are connected in series in the bias lines between the control terminals, furthermore, the switch can be operated with a low power consumption.

What is claimed is:

1. A high-frequency switch comprising:

three ports consisting of a first port, a second port and a third port;

a first distributed constant line and a second distributed constant line which are connected in series between said first and second ports;

a third distributed constant line and a fourth distributed constant line which are connected in series between said second and third ports;

a first diode connected between said first port and ground;

a second diode connected between a junction point between said first and second distributed constant lines and ground;

a third diode connected between a junction point between said third and fourth distributed constant lines and ground;

a fourth diode connected between said third port and ground;

a first resistor and a second resistor which are connected in series between grounded electrodes of said first and fourth diodes; and a third resistor and a fourth resistor which are connected in series between grounded electrodes of said second and third diodes;

said first and second diodes having different polarity, said third and fourth diodes having different polarity and said first and fourth diodes having different polarity with respect to a line between said first and third ports, said switch being capable of selectively connecting said second port with said first port or said third port.

2. The high-frequency switch of claim 1 further comprising at least one grounding capacitor inserted between at least one end of at least one of said distributed constant lines and ground.

3. The high-frequency switch of claim 1 further comprising a discharge resistor connected between both electrodes of at least one of said diodes.

4. The high-frequency switch of claim 2 further comprising a discharge resistor connected between both electrodes of at least one of said diodes.

5. The high-frequency switch of claim 1 further comprising an inductance-providing line having inductance connected between both electrodes of at least one of said diodes, wherein electrostatic capacitance of said one diode when in OFF condition and the inductance of said inductance-providing line together serve as a parallel-connected resonant circuit.

6. The high-frequency switch of claim 2 further comprising an inductance-providing line having inductance connected between both electrodes of at least one of said diodes, wherein electrostatic capacitance of said one diode when in OFF condition and the inductance of said inductance-providing line together serve as a parallel-connected resonant circuit.

7. The high-frequency switch of claim 5 wherein said inductance-providing line includes an inductor and a capacitor connected in series.

8. The high-frequency switch of claim 6 wherein said inductance-providing line includes an inductor and a capacitor connected in series.

9. The high-frequency switch of claim 1 further comprising a parallel connection of an inductance-providing line having inductance and a capacitor-containing line connected between both electrodes of at least one of said diodes, wherein combined electrostatic capacitance of said one diode when in OFF condition and said capacitor-containing line and the inductance of said inductance-providing line together serve as a parallel-connected resonant circuit.

10. The high-frequency switch of claim 2 further comprising a parallel connection of an inductance-providing line having inductance and a capacitor-containing line connected between both electrodes of at least one of said diodes, wherein combined electrostatic capacitance of said one diode when in OFF condition and said capacitor-containing line and the inductance of said inductance-providing line together serve as a parallel-connected resonant circuit.

11. The high-frequency switch of claim 9 wherein said inductance-providing line includes an inductor and a capacitor connected in series.

12. The high-frequency switch of claim 10 wherein said inductance-providing line includes an inductor and a capacitor connected in series.

* * * * *